United States Patent [19]
Saito

[11] Patent Number: 5,837,597
[45] Date of Patent: Nov. 17, 1998

[54] METHOD OF MANUFACTURING SEMICONDUCTOR DEVICE WITH SHALLOW IMPURITY LAYERS

[75] Inventor: Shuichi Saito, Tokyo, Japan

[73] Assignee: NEC Corporation, Tokyo, Japan

[21] Appl. No.: 576,458

[22] Filed: Dec. 21, 1995

[30] Foreign Application Priority Data

Dec. 21, 1994 [JP] Japan .................................. 6-318127

[51] Int. Cl.$^6$ ................................................ H01L 21/425
[52] U.S. Cl. .......................... 438/528; 438/530; 438/526; 438/514
[58] Field of Search ................................. 438/514, 526, 438/527, 528, 529, 530

[56] References Cited

U.S. PATENT DOCUMENTS

| | | | |
|---|---|---|---|
| 4,889,819 | 12/1989 | Davari et al. | 438/527 |
| 4,961,165 | 10/1990 | Ema | 438/526 |
| 5,145,794 | 9/1992 | Kase et al. | 438/257 |
| 5,378,650 | 1/1995 | Kimura | 438/526 |
| 5,538,913 | 7/1996 | Hong | 438/526 |
| 5,654,210 | 8/1997 | Aronowitz et al. | 438/526 |

FOREIGN PATENT DOCUMENTS 53-12266  2/1978  Japan .
5-335559 12/1993  Japan .

OTHER PUBLICATIONS

T. Shibata et al., "Formation of Ultra–Shallow Low–Reverse Current n+p Junctions by 450°C. Furnace Annealing", *IEEE* 1990, pp. 63 and 64.

*Primary Examiner*—Trung Dang
*Attorney, Agent, or Firm*—Young & Thompson

[57] ABSTRACT

A method of manufacturing a semiconductor device in which a first ion implantation is carried out into a semiconductor substrate. Then, a second ion implantation is carried out to a projection range deeper than that of the first ion implantation. The ions of the second implantation are formed from the same type of atoms constituting the semiconductor substrate or from impurity atoms having the same conduction type as the semiconductor substrate at the projection range of the second ion implantation. A further ion implantation may be carried out to electrically shield the second implantation, or the method may be carried out in a SOI substrate with the second implantation extending through the insulating layer of the SOI structure.

23 Claims, 3 Drawing Sheets

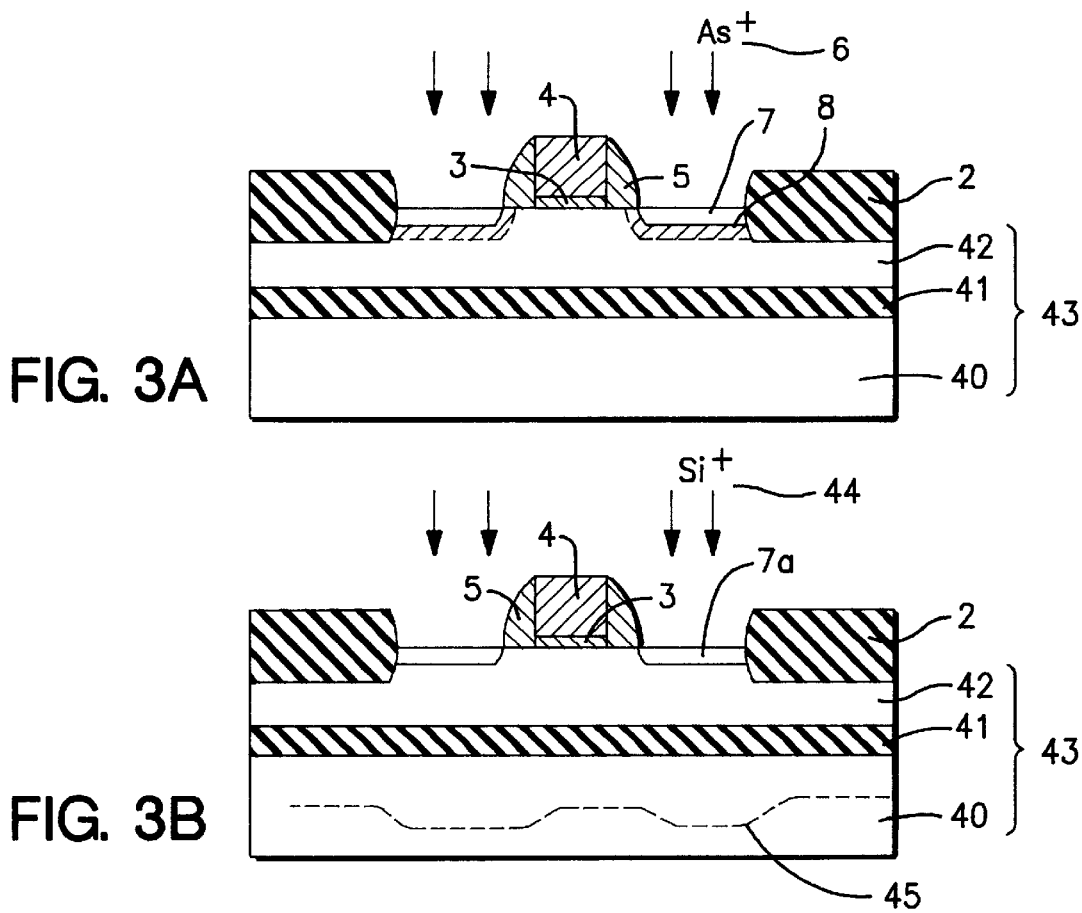
FIG. 3A
FIG. 3B
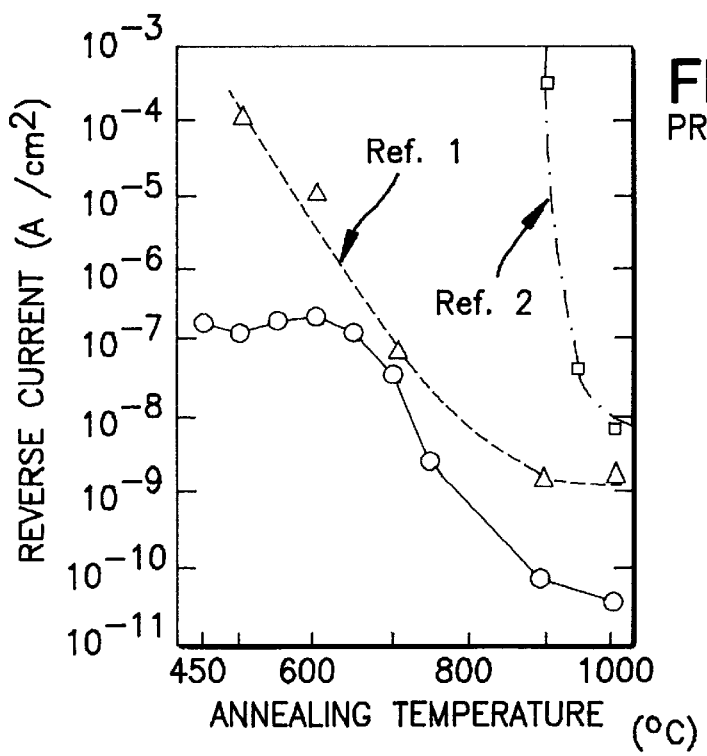
FIG. 4
PRIOR ART

METHOD OF MANUFACTURING SEMICONDUCTOR DEVICE WITH SHALLOW IMPURITY LAYERS

BACKGROUND OF THE INVENTION

1. Field of the Invention

The present invention relates to a method of manufacturing a semiconductor device in which a shallow impurity layer is formed during channel implantation, lightly doped drain (LDD) implantation, source-drain implantation or the like.

2. Description of the Prior Art

Accompanying a decrease of a channel length of a MOSFET, it becomes necessary to reduce the depth of the channel implantation region and the source-drain implantation region.

In order to form such a shallow impurity layer, it is known to reduce the acceleration voltage of an impurity ion implantation and to use a low temperature annealing or a high temperature, short time, annealing in order to suppress the impurity diffusion.

The conventional technology for forming a shallow source/drain junction will now be described with reference to the example disclosed in T. Shibata, et al., Abstracts of the 1990 VLSI Symposium, p.63.

Describing first the process flow of the formation of an impurity layer, after the formation of an oxide film for element isolation on a semiconductor substrate, $As^+$ ions are implanted (25 keV, $2\times10^{15}$ atoms/cm$^2$) using a clean ion implantation machine kept at a high vacuum and reduced metallic contamination, then the substrate is subjected to a heat treatment at a temperature in the range of 450° to 1000° C.

FIG. 4 is a characteristic diagram displaying the dependence of a leakage current (reverse biased junction current) on the annealing temperature. In the figure, Ref. 1 is K. Tsukamoto, Y. Akasaka, Y. Watari, Y. Kusano, Y. Hirose, and G. Nakamura, Jpn. J. Appl. Phys. Vol. 17, Suppl. 17-1, p. 187 (1987) and Ref. 2 is A. E. Michel, F. F. Fang, and E. S. Pan, J. Appl. Phys., Vol. 45, p. 2991 (1947) show the cases in which above-mentioned ion implantation device is not used, whereas the solid curve shows the case where above-mentioned ion implantation device is used.

As is evident from FIG. 4, the leakage current is increased extremely rapidly in Ref. 1 and Ref. 2 as the heat treatment temperature goes down.

On the other hand, in the case of the solid line, the leakage current does not increase so much. This improvement in the leakage current was achieved by the reduction of contamination at the time of ion implantation.

However, the cause of the increase of the leakage current with the reduction of the treatment temperature is considered to be the crystal defects generated during the ion implantation. These defects are formed as follows. Namely, when the As ions are implanted at a high concentration, the implanted region becomes amorphous and a large number of interstitial silicon atoms are formed in a transition region between the crystal phase and the amorphous phase.

If the heat treatment temperature is lowered in order to suppress the diffusion of the impurity for forming a shallow impurity layer, these defects remain at the junction position because of the nondiffusion of the impurity. These defects are considered as the cause of the leakage current.

On the other hand, if a heat treatment at a high temperature is carried out after the ion implantation, the impurity ions undergo enhanced diffusion due to the interstitial silicons formed in the transition region between the crystal phase and the amorphous phase. Therefore, the leakage current decreases because the position of the P-N junction moves to outside of the defect region.

However, this method is not preferred for forming small devices because the junction depth is increased due to the enhanced diffusion. Therefore, it is necessary to reduce the effect of the enhanced diffusion caused by the interstitial silicon atoms.

SUMMARY OF THE INVENTION

This invention was motivated by the need to resolve this problem, and it is therefore the object of this invention to decreases the diffusion of the implanted impurities without the increase of the leakage current.

The method of manufacturing the semiconductor device according to this invention is characterized in that after formation of an impurity region by implantation of a first kind of ions into a semiconductor substrate, a second kind of ions are implanted to a region with larger depth than that of the impurity region of the first kind of ions to form a vacancy region so that the vacancy region covers the impurity region.

BRIEF DESCRIPTION OF THE DRAWINGS

The above-mentioned and other objects, features and advantages of this invention will become more apparent by reference to the following detailed description of the invention taken in conjunction with accompanying drawings, in which:

FIGS. 3(a) to 3(b) illustrate sectional views showing the constitution of the semiconductor device in the case of using an SOI substrate of a fourth embodiment of this invention; and FIG. 4 is a characteristic diagram showing the result of an evaluation of the leakage current in the diffused layer in a conventional semiconductor device.

DESCRIPTION OF THE PREFERRED EMBODIMENTS

Figure 1A:
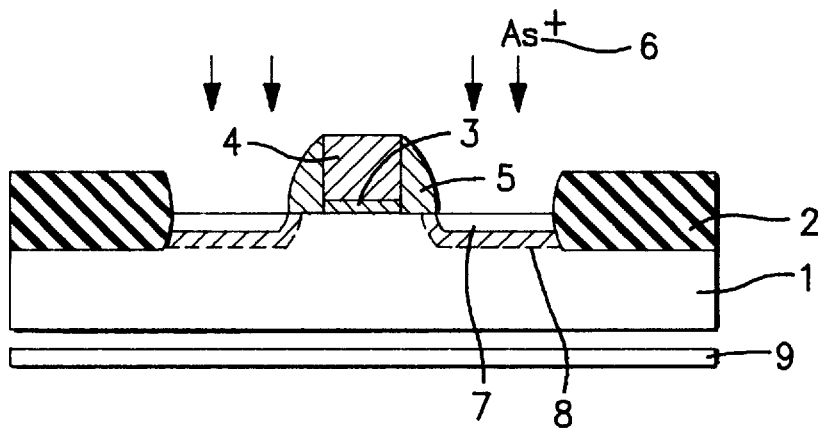
FIGS. 1(a) to 1(c) illustrate sectional views showing the constitution of a MOS transistor of a first embodiment of this invention, and a characteristic diagram showing the impurity distribution in the transistor.

Before a detailed description of the embodiments of the invention, an outline of this invention will be described.

In order to form a shallow impurity layer by ion implantation method, it is indispensable to reduce the number of defects generated during the ion implantation.

The most significant defects caused during the ion implantation are the interstitial silicon atoms in the transition region between the crystal phase and the amorphous phase. These interstitial atoms generate the dislocations in a later heat treatment.

When the heat treatment temperature is low, naturally these dislocations will not disappear. Besides, even when high temperature processing, for example, a heat treatment at about 1100° C., is carried out, it is not impossible to eliminate the dislocations but this heat treatment will further causes an enhanced diffusion of the impurity due to the interstitial silicon atoms.

Therefore, it is necessary to decrease the interstitial silicon atoms generated during the impurity implantation to reduce the enhanced diffusion. As mentioned above, the interstitial silicon atoms exist mainly in the transition region. Therefor, the implantation energy should be decreased so that a width of the transition region decreases. A preferable energy is less than several tens of Kiloelectron volts, for example, below about 30 KeV. Further, it is preferable for reducing the interstitial atoms to cool the substrate during the ion implantation in order to reduce lattice vibrations so that the generation of the interstitial silicon atoms decreases.

Since the method mentioned earlier can not sufficiently suppress the generation of the interstitial silicon atoms completely, another way is needed for reducing the effect of the enhanced diffusion. For this purpose, it is effective to absorb the interstitial silicon atoms into silicon vacancies so that the interstitial silicon atoms disappear. The vacancies can be introduced into the substrate by using another ion implantation with a higher energy than that of the preceding impurity implantation for introducing the impurities into the substrate so that a region including the vacancies covers the transition region mentioned above. This implantation may use a kind of ion that is the same as the atoms constituting the substrate, for example, Si, Ge.

Here, if an amount of the interstitial silicon atoms is large, the ion implantation for introducing the vacancies must be carried out with a large dose. However, such an ion implantation causes new defects in the substrate, especially near the projection range. These defects affect device characteristics. Therefore, it is necessary to implant the ions to a deep location where a depletion region formed on the surface of the substrate does not reach. Further, it is effective to shield the defects electrically. For example, in a case that the device is formed in a retrograde well in which impurity concentration is high near the well junction, it is necessary to implant ions for introducing the vacancies so that the peak concentration of the ions exists near the well junction because the influence of the defects is shielded by the high impurity concentration of the well.

Another method is to carry out a first ion implantation of Si, Ge or the like that are the same kind of atoms constituting the substrate and carry out a further implantation of B, P or the like of which conduction type is the same as that of the substrate at a location of the projection range of the first ion implantation.

A still another method is to implant ions of a conduction type that is the same as that of the semiconductor substrate so that the generated defects are shielded by the impurities of the substrate.

Of course, it is effective to cool the substrate during the ion implantation for decreasing the generation of the defects.

In the above, the case of using a bulk substrate as the substrate has been described, but the generation of the defects at the time of the ion implantation for the purpose of introducing the vacancies can be avoided if an SOI substrate with built-in insulating layer is employed.

Namely, by setting the projection range of this ion implantation to below the embedded insulating layer of the SOI substrate, the defects are formed in the substrate below the insulating layer. Therefore, the vacancies alone can be formed in the silicon layer above the embedded insulating layer where the elements are formed.

Because of this, the vacancies due to the ion implantation will not be generated in the element formation region, while the generation of the interstitial silicons can also be suppressed.

Referring to the drawings, the embodiments of this invention will be described in the following.

Figure 1B:
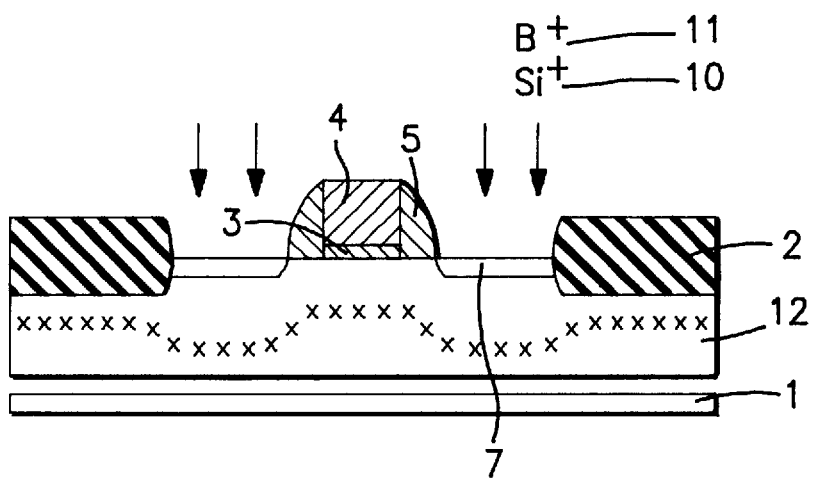
Figure 1C:
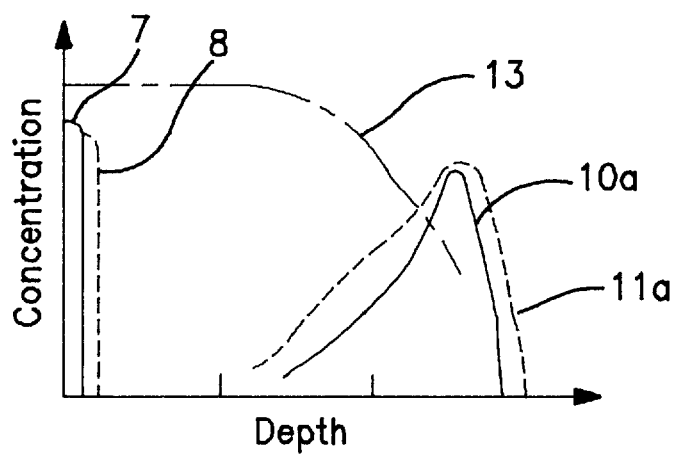

FIGS. 1 (a)–(b) illustrate sectional views showing the constitution of a MOS transistor which is the first embodiment of this invention, and FIG. 1(c) shows the vacancy distribution in the transistor.

In the figures, 1 is a silicon substrate, 2 is a field oxide film, 3 is a gate oxide film, 4 is a gate electrode, 5 is a sidewall formed on the gate electrode 4 and 6 is $As^+$ to be implanted.

As shown in FIG. 1(a), $As^+$ ions are implanted under the conditions of 10 keV and $2 \times 10^{15}$ atoms $cm^{-2}$ after the formation of the sidewall 5, to form a source/drain region 7. At that time, the rear surface of the silicon substrate 1 is cooled to a temperature of $-100°$ C. using a substrate cooling mechanism 9.

However, even in that case, an interstitial silicon generating region 8 is formed below an impurity implantation region 7, and complete elimination of the interstitial silicons is not possible even with the cooling at $-100°$ C.

Further ion implantations carried out under cooling of the substrate down to the temperature of 77K revealed that the interstitial silicons are not removed completely, although their number decreased with the reduction in the temperature of the substrate.

Next, as shown in FIG. 1(b), $Si^+$ ions 10 are implanted into such a sample under the conditions of 1.5 MeV and $3 \times 10^{13}$ atoms $cm^{-2}$.

In addition, $B^+$ ions 11 are implanted so that the projection range thereof is substantially the same of the implanted $Si^+$ ions, under the conditions of 850 keV and $8 \times 10^{12}$ $cm^{-2}$, to form an ion implanted region 12 (FIG. 1(b)).

Following that, the sample is subject to a lamp annealing at 1000° C. for 10 seconds.

FIG. 1(c) is a distribution characteristic diagram showing the distributions of the implanted ions and the distribution 13 of the vacancies generated by the $Si^+$ implantation.

The interstitial silicon region 8 below the impurity implanted region 7 is covered with the vacancy distribution 13. Thus the interstitial silicons are absorbed by the vacancies.

Moreover, a defective region 10a including interstitial silicons formed by the implantation of the $Si^+$ ions 10 is covered with a $B^+$ region 11a formed by the implantation of the $B^+$ ions 11. Therefore, the region 10a is shielded electrically so that it does not affect the device characteristics.

The result of the evaluation showed that the leakage current is less than $10^{-10}$ A and the diffused layer has a small junction depth of 0.08 μm.

Next, a second embodiment will be described. In this embodiment, the constitution of the MOS transistor is the same as that of the first embodiment.

However, in contrast to the introduction of the vacancies by the implantation of the $Si^+$ ions 10 and the avoidance of the influence of the defects formed by the $Si^+$ ions 10 by the implantation of the $B^+$ ions 11 in the first embodiment, $Ga^+$ ions are used in this embodiment.

Namely, the $Ga^+$ ions are implanted under the conditions of 2.5 MeV and $3 \times 10^{12}$ atoms $cm^{-2}$. Since the $Ga^+$ ion has a large mass, sufficient number of vacancies can be introduced by the implantation of the $Ga^+$ ions even when the dose of $Ga^+$ is small.

Besides, since Ga is a p-type impurity, the concentration of the impurities is further increased within the p well so that the defects formed by the implantation of the Ga$^+$ ions are shielded electrically.

Consequently, the introduction of Ga$^+$, Sb$^+$, As$^+$ or the like which acts as an impurity to the semiconductor substrate makes the fabrication process simpler.

The use of the Ga$^+$ or B$^+$ ions is effective in the case of ion implantation for the formation of the vacancies within a p well, while the use of the P$^+$, As$^+$ or Sb$^+$ ions is effective in the case of ion implantation for the formation of the vacancies within an n well.

It should be noted that the implantation for introducing the vacancies is carried out within the well in the above embodiments, but the ions may be implanted outside of the well.

Accompanying the smaller geometry of the devices, the depth of the well decreases, and a well region with the depth about 1 to 2 um is not uncommon.

Accordingly, if the ions As$^+$ or P$^+$ are implanted in the lower part of a well under the conditions of 3 MeV and 4×10 atoms$^{12}$ cm$^{-2}$, for example, the defects generated by such an ion implantation itself will cause no problem, and yet a sufficient number of vacancies will be generated in the surface layer of the semiconductor substrate.

In the following, a third embodiment of this invention related to a method for forming a shallow impurity layer with low impurity concentration, such as a channel implantation or an LDD implantation in a MOS transistor, will be described.

Figure 2A:
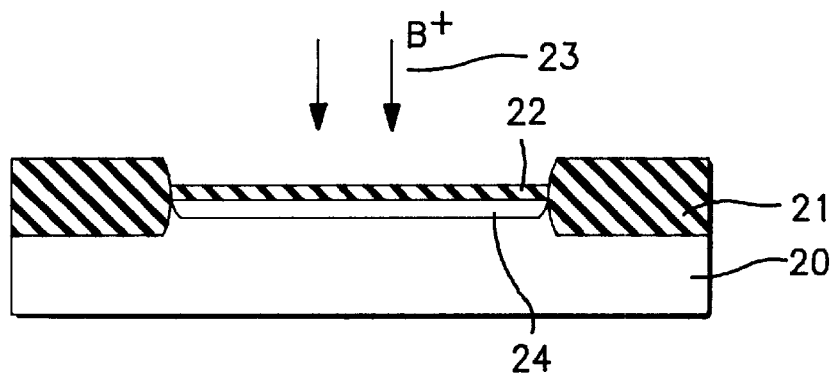
FIGS. 2(a) to 2(c) illustrate sectional views showing the constitution of the semiconductor device of a third embodiment of this invention, and a characteristic diagram showing the impurity distribution in the device.
Figure 2B:
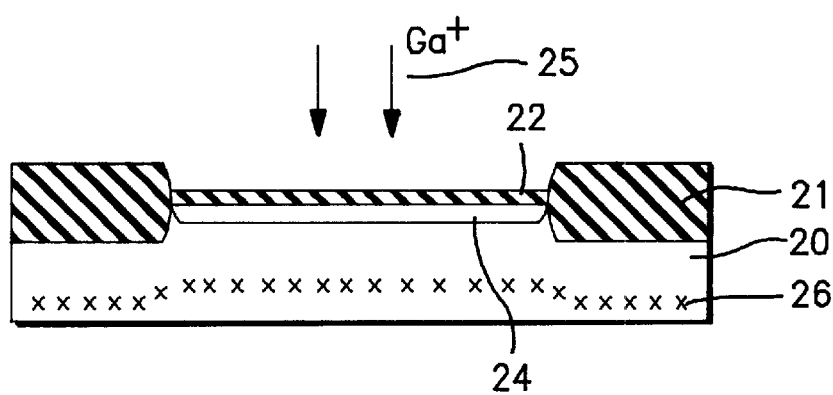
Figure 2C:
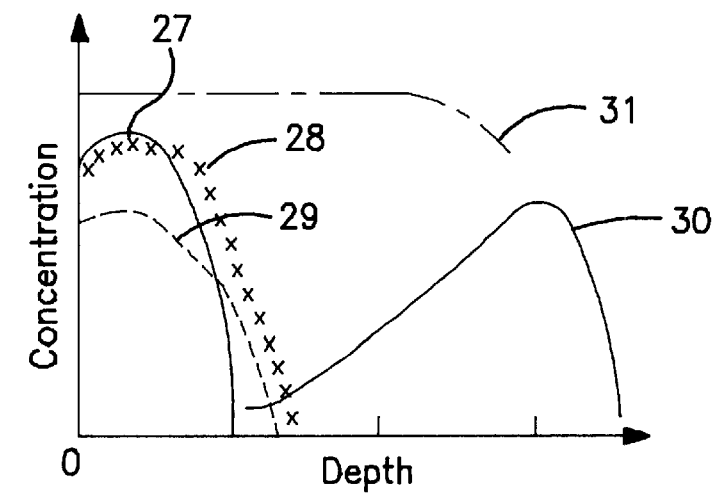

FIGS. 2(a)–2(b) illustrate sectional views showing the constitution of the semiconductor device of the third embodiment and FIG. 2(c) shows the impurity distribution in the device.

First, B$^+$ ions 23 are implanted under the conditions of 5 keV and 8×10$^{12}$ atoms cm$^{-2}$ into a silicon substrate 20 as a channel implantation for an n-channel MOS transistor through an oxide film 22. By this process, a B distribution 24 is formed. Then, as shown in FIG. 2(b), the Ga$^+$ ions 25 are implanted under the conditions of 2 MeV and 5×10$^{12}$ atoms cm$^{-2}$ to form a Ga distribution 26 in the silicon substrate at the depth of about 1.1 μm. Following that, the sample is subjected to a heat treatment at 750° C. for 20 min.

In FIG. 2(c) which shows the impurity distributions after the heat treatment, the B distribution 28 without Ga$^+$ ion implantation spreads wide due to enhanced diffusion caused by the presence of the interstitial silicon atoms shown as curve 29.

In contrast, the spreading of a B distribution 27 with the Ga$^+$ ion implantation is restrained by the presence of the vacancy distribution 31 formed by the implantation of the Ga$^+$ ions. Therefore, the shallower impurity distribution 27 is obtained so that the interstitial silicon atoms are absorbed into the vacancies. In FIG. 2(c), reference symbol 30 shows the distribution of Ga$^+$ ions.

A fourth embodiment of this invention will be described next.

FIGS. 3(a)–(b) illustrate sectional views of the constitution of the semiconductor device according to the fourth embodiment of this invention.

As shown in the figures, an SOI substrate 43 is constituted of a substrate silicon 40, a 0.1 μm-thick embedded insulating layer 41 and a 50 nm-thick surface silicon layer 42.

The SOI substrate 43 may be formed either by lamination method or by forming an embedded oxide film by the implantation of oxygen ions.

A gate electrode 4 is formed on a gate insulating film 3 then a sidewall 5 is formed.

Then, the As$^+$ ions 6 are implanted under the conditions of 8 keV and 1×10$^{15}$ atoms cm$^{-2}$. An impurity implanted region 7 and an interstitial silicon region 8 are formed as a result of the above process.

Next, the Si$^+$ ions 44 are implanted under the conditions of 500 keV and 5×10$^{13}$ atoms cm$^{-2}$. By this implantation, a silicon distribution 45 having a peak concentration at a location about 0.8 μm from the surface of the SOI substrate 43 is formed. Thus, almost no Si$^+$ ions exist in the surface silicon layer 42. By this ion implantation, a vacancy region is introduced in the surface silicon layer 42.

Then the sample is subjected to a lamp annealing at 1000° C. for 10 seconds. The enhanced diffusion of the As$^+$ ions is restrained so that a shallow impurity layer 7a is formed.

It should be noted that the diffusion conditions of the high concentration layer of As$^+$ or the low concentration layer of B$^+$ have been described in the above embodiments, but this invention is neither limited to such ion species nor is dependent on the implanted amount of the ion.

Since the impurity region formed by any ion implantation method is accompanied more or less with the generation of interstitial silicons, this invention can be said to be a technology covering the entire filed of ion implantation.

As described above, for the formation of a shallow impurity layer it is indispensable to eliminate the interstitial silicons introduced during the ion implantation for forming device structures. For this purpose, another ion implantation is carried out to form the vacancy region which covers the interstitial silicon region. Therefore, the interstitial silicon atoms are absorbed into the vacancies during the annealing process so that the effect of the enhanced diffusion is suppressed. Thus, the shallow junction is obtained.

In the embodiments described above, of course, it is possible to exchange a order of the implantation for implanting impurities and the implantation for introducing vacancies into the substrate.

Moreover, the use of an SOI substrate avoids the need for the impurity implantation for shielding the ions that are for introducing the vacancies.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method of manufacturing a semiconductor device comprising the steps of:

implanting first impurities with a first projection range into a semiconductor substrate;

implanting first ions with a second projection range into said semiconductor substrate to introduce vacancies into said semiconductor substrate, said second projection range being deeper than said first projection range; and implanting second ions with a third projection range into said semiconductor substrate, said second ions being formed from impurity atoms that have a same conduction type as said semiconductor substrate at a location of said third projection range, said third projection range being set so that both distributions of said first and second ions overlap each other.

2. The method as claimed in claim 1, wherein said second projection range is deeper than a depletion region formed on said semiconductor substrate.

3. The method as claimed in claim 1, wherein said first ions are formed from a same kind of atoms as said semiconductor substrate.

4. The method as claimed in claim 3, wherein said semiconductor substrate comprises silicon atoms and said first atoms are formed from silicon atoms.

5. The method as claimed in claim 4, wherein said second ions are selected from one of $B^+$ and $Ga^+$ ions when said conduction type of said semiconductor substrate is P-type and selected from one of $P^+$, $As^+$ and $Sb^+$ when said conduction type of said semiconductor substrate is N-type.

6. The method as claimed in claim 1, further comprising annealing said semiconductor substrate for a short time at a high temperature.

7. The method as claimed in claim 1, wherein said second ions are formed from impurity atoms having a same conduction type as said semiconductor substrate at a location of said second projection range.

8. The method as claimed in claim 7, wherein said second ions are selected from one of $B^+$ and $Ga^+$ ions when said conduction type of said semiconductor substrate is P-type and selected from one of $P^+$, $As^+$ and $Sb^+$ when said conduction type of said semiconductor substrate is N-type.

9. The method as claimed in claim 7, further comprising annealing said substrate for a short time at a high temperature.

10. A method of manufacturing a semiconductor device comprising the steps of:

implanting first impurities with a first projection range into a semiconductor substrate; and implanting first ions with a second projection range into said semiconductor substrate to introduce vacancies into said semiconductor substrate, said second projection range being deeper than said first projection range, wherein said semiconductor substrate is a SOI structure.

11. The method as claimed in claim 10, wherein said second projection range is larger than a thickness of a surface semiconductor region of said SOI substrate and said first ions are formed from a same kind of atoms as said surface semiconductor region.

12. The method as claimed in claim 11, further comprising annealing said semiconductor substrate for a short time at a high temperature.

13. A method of manufacturing a semiconductor device comprising the steps of:

implanting impurities with a first projection range into a semiconductor substrate for forming a source and drain region of a MOSFET;

implanting first ions with a second projection range into said semiconductor substrate to introduce vacancies into said semiconductor substrate, said second projection range being deeper than said first projection range; and implanting second ions with a third projection range into said semiconductor substrate, said second ions being formed from impurity atoms that have a same conduction type as said semiconductor substrate at a location of said third projection range, said third projection range being set so that both distributions of said first and second ions overlap each other.

14. The method as claimed in claim 13, wherein said second projection range is deeper than a depletion region for said source and drain region.

15. The method as claimed in claim 13, wherein said first ions are formed from a same kind of atoms as said semiconductor substrate.

16. The method as claimed in claim 15, wherein said semiconductor comprises silicon atoms and said first ions are formed from silicon atoms.

17. The method as claimed in claim 16, wherein said second ions are selected from one of $B^+$ and $Ga^+$ ions when said conduction type of said semiconductor substrate is P-type and selected from one of $P^+$, $As^+$ and $Sb^+$ when said conduction type of said semiconductor substrate is N-type.

18. The method as claimed in claim 13, further comprising annealing said semiconductor substrate for a short time at a high temperature.

19. A method of manufacturing a semiconductor device comprising the steps of:

forming an insulating layer between two silicon layers;

implanting first impurities with a first projection range into a first of the two silicon layers; and implanting first ions with a second projection range through said insulating layer to introduce vacancies into said first layer, said second projection range being deeper than said first projection range.

20. The method as claimed in claim 19, wherein said second projection range is deeper than a depletion region for said semiconductor device in said first layer.

21. The method as claimed in claim 20, wherein said first ions are $Ga^+$ ions.

22. The method of claim 1, wherein the implantation of the first ions is at a concentration that is about two orders of magnitude less than the implantation concentration of the first impurities.

23. The method of claim 22, wherein the first ions are $Si^+$ ions and their implantation concentration is about $3\times10^{13}$ atoms $cm^{-2}$.

* * * * *